United States Patent [19]
Spivey et al.

[11] Patent Number: 5,121,124
[45] Date of Patent: Jun. 9, 1992

[54] MICROWAVE CAMERA

[75] Inventors: Brett A. Spivey, Encinitas; Paul A. Johnson; Alex Shek, both of San Diego, all of Calif.; Chester Phillips, Columbia, Md.

[73] Assignee: Thermo Electron Technologies Corp., San Diego, Calif.

[21] Appl. No.: 694,098

[22] Filed: May 1, 1991

[51] Int. Cl.⁵ .................................................. G01S 3/02
[52] U.S. Cl. ........................................ 342/179; 342/351
[58] Field of Search .................................. 342/179, 351

[56] References Cited

U.S. PATENT DOCUMENTS

| | | | |
|---|---|---|---|
| 4,521,861 | 6/1985 | Logan et al. | 342/351 X |
| 4,654,666 | 3/1987 | Wiley | 342/351 |
| 4,864,308 | 9/1989 | Raab et al. | 342/351 |
| 4,910,523 | 3/1990 | Huguenin et al. | 342/351 X |

*Primary Examiner*—Mark Hellner
*Attorney, Agent, or Firm*—John R. Ross

[57] ABSTRACT

A camera system in which microwave radiation from objects in a field-of-view is collected by an antenna having a beam direction which is a function of the beam frequency. The collected radiation is analyzed to produce an image of the objects in the field-of-view. In a simple embodiment of the invention a one dimensional image is produced. This one dimensional image can be converted to a two dimensional image by rotating the camera system or mounting the camera on a moving platform. In a preferred embodiment of the present invention the microwave radiation collected by the antenna is converted into electronic acoustic signals which sets up a diffraction pattern in a Bragg cell to diffract a laser beam which is focused on a television camera to produce one dimensional image of the field-of-view. The antenna can be scanned to produce a two dimensional image. In another preferred embodiment an array of antennas and a multi-channel Bragg cell is used to produce a two dimensional real time image. The camera is capable of imaging objects through media such as wooden walls which are transparent to microwaves but are opaque to visible light.

21 Claims, 12 Drawing Sheets

MICROWAVE CAMERA

BACKGROUND TO THE INVENTION

This invention is related to cameras and in particular to microwave cameras.

It is known that radar beams broadcasted from microwave radar antennas of a variety of designs can be effectively steered by imposing slight variations in the frequency of the beam being broadcasted.

The emitted microwave radiation from most objects over small frequency intervals in terms of frequency interval, temperature and emissivity can generally be approximated by:

$$P_{\Delta f} \approx K \epsilon T \Delta f \text{ watts} \cdot \text{cm}^{-2} \cdot \text{ster}^{-1}$$

Where
K is a constant,
$\epsilon$ is the emissivity relative to blackbody radiation
T is absolute temperature, °K.,
$\Delta f$ is the frequency interval in Hz, and
$P_{\Delta f}$ is the power of the radiation.

Thus, for a given $\Delta f$ the emitted power is proportional to $\epsilon T$ for the body and is typically not a function of frequency. In addition to emitted radiation most bodies to some extent reflect microwave radiation from the surroundings and some bodies which are transparent will transmit energy from objects behind it.

A concept of radiometric temperature is useful in considering microwave systems. The radiometric temperature of a body is defined as being equal to the thermometric temperatures of an ideal black body that would give the same radiation as that emanating from the body. A convenient expression for the radiometric temperature is:

$$T = \epsilon T_1 + r T_2 + \tau T_3$$

in which
$T_1$ = thermometric temperature of body, °K.,
$T_2$ = radiometric temperature of an object whose radiation is reflected by the body, °K.,
$T_3$ = radiometric temperature of any object whose radiation is transmitted through the body °K.,
r = reflectivity, and
$\tau$ = transmissibility
At equilibrium, $\epsilon = (1 - r - t)$ so $$T = (1 - r - t) T_1 + r T_2 + \tau T_3$$

For water $\epsilon$ is close to 1, for metallic objects r is close to 1, and for many natural objects t is close to one. For most objects $\epsilon$, $\tau$ and r change slowly with the frequency of microwave radiation over most of the spectrum. For many outdoor situations $T_1$ will be in the range of about 300° K. and $T_2$ representing the temperature of of the sky will be in the range of a few degrees K. (say 10° K.). Thus, for an outdoor target comprised of aluminum foil reflecting the sky with r of about 1.0 mounted on opaque non reflecting background, $T_B/T_A$ would be:

$$\frac{T_B}{T_A} \approx \frac{300}{10} \approx 30$$

where
$T_B$ = temperature of the background and,
$T_A$ = temperature of the aluminum foil.

Thus, microwave radiation emanating from the non-reflecting background should be about a factor of up to about 30 greater than that emanating from aluminum foil reflecting the sky.

Spectrum analyzer systems for microwaves are well known and are commercially available. It is known that acoustic waves can be generated in a Bragg cell to produce diffraction patterns capable of deflecting a laser beam.

SUMMARY OF THE INVENTION

The present invention provides a camera system in which microwave radiation from objects in a field-of-view is collected by an antenna having a beam direction which is a function of the beam frequency. The collected radiation is analyzed to produce an image of the objects in the field-of-view. In a simple embodiment of the invention a one dimensional image is produced. This one dimensional image can be converted to a two dimensional image by rotating the camera system or mounting the camera on a moving platform. In a preferred embodiment of the present invention the microwave radiation collected by the antenna is converted into an electronic acoustic signal which set up a diffraction pattern in a Bragg cell to diffract a laser beam which is focused on a television camera to produce one dimensional image of the field-of-view. The antenna can be scanned to produce a two dimensional image. In another preferred embodiment an array of antennas and a multi-channel Bragg cell is used to produce a two dimensional real time image. The camera is capable of imaging objects through media such as wooden walls which are transparent to microwaves but are opaque to visible light.

DETAILED DESCRIPTION OF PREFERRED EMBODIMENTS

The present invention can be described by reference to the figures.

In this specification and in the appended claims the term "microwave radiation" is intended to cover electromagnetic radiation within a frequency range of about $10^9$ Hz to about $10^{12}$ Hz.

PROTOTYPE

A prototype demonstration unit is described in FIGS. 1A, 1B, 2A, 2B and 3. A one meter long microwave antenna 2 is mounted at the focus of a parabolic reflector 4 which is mounted on a table 5 rotatable around the focus of reflector 4. Parabolic reflector 4 limits the horizontal field-of-view of microwave antenna 2 to about 1 degree. Cut in the face (side 6) of antenna 2 are 112 slots for collecting microwave radiation. The spacing of these slots are chosen to permit the antenna to detect microwave radiation in the range of approximately 17–21 GHz. The slots are described in Table 1.

TABLE 1

| SLOT Number | $\Theta_N$ |
| --- | --- |
| 1–10 | 2.5° |
| 11–20 | 5° |
| 21–30 | 7° |
| 31–40 | 8.4° |
| 41–50 | 9.5° |
| 51–60 | 10.5° |
| 61–70 | 11° |
| 71–80 | 11° |
| 81–90 | 11.5° |
| 91–100 | 11.5° |
| 101–106 | 12° |
| 106–112 | 13° |

Figure 1A:
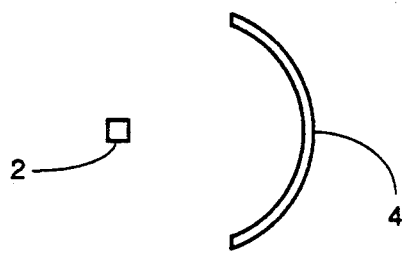
FIGS. 1A and 1B are two views of a preferred embodiment of the present invention.
Figure 1B:
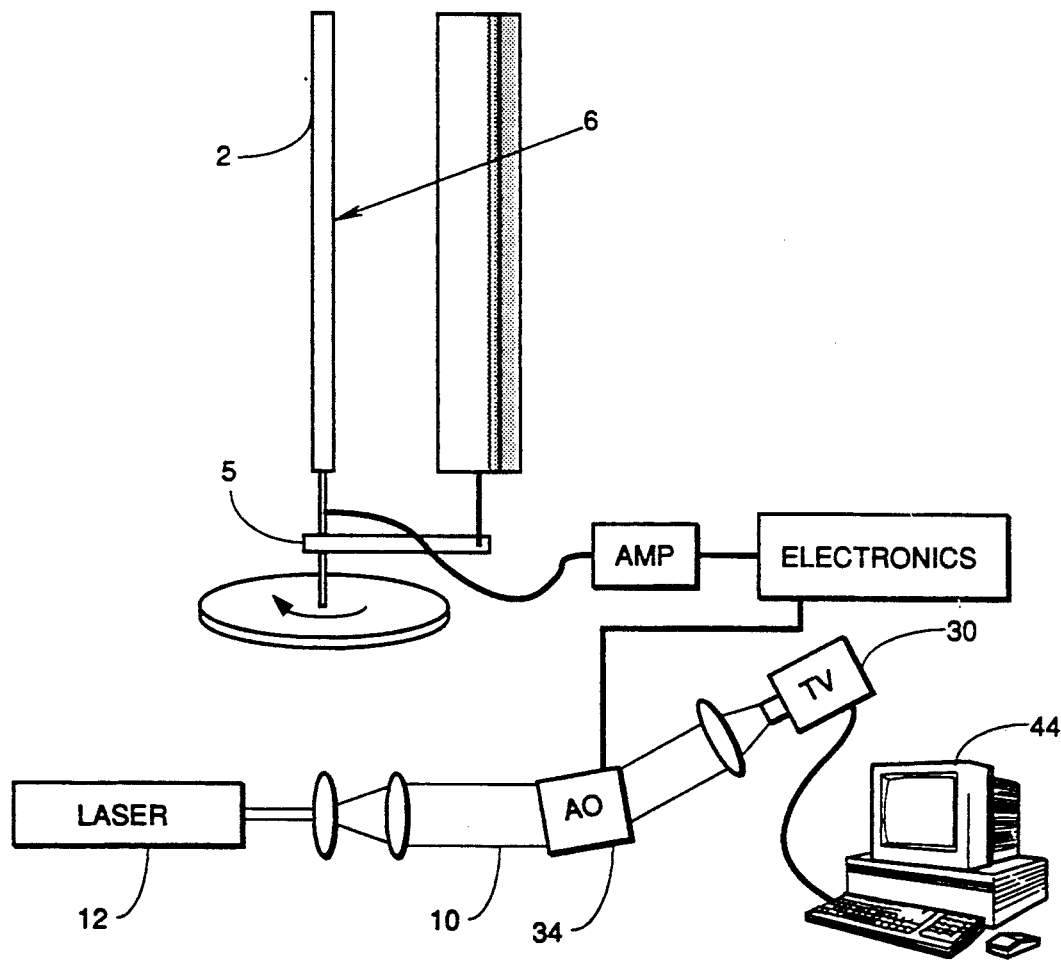
Figure 2A:
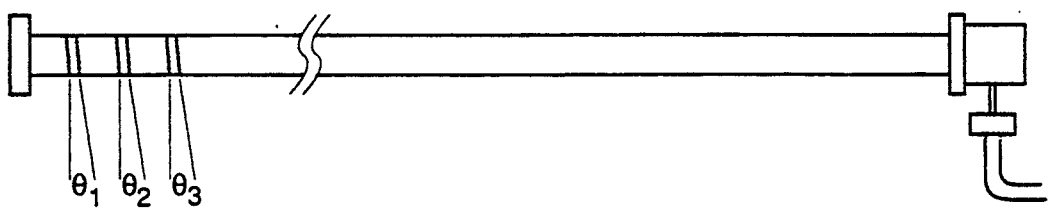
FIGS. 2A and 2B are two views of a microwave waveguide antenna.
Figure 2B:
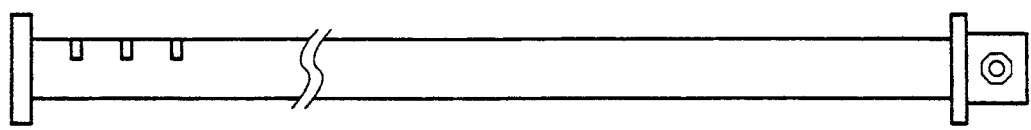
Figure 3:
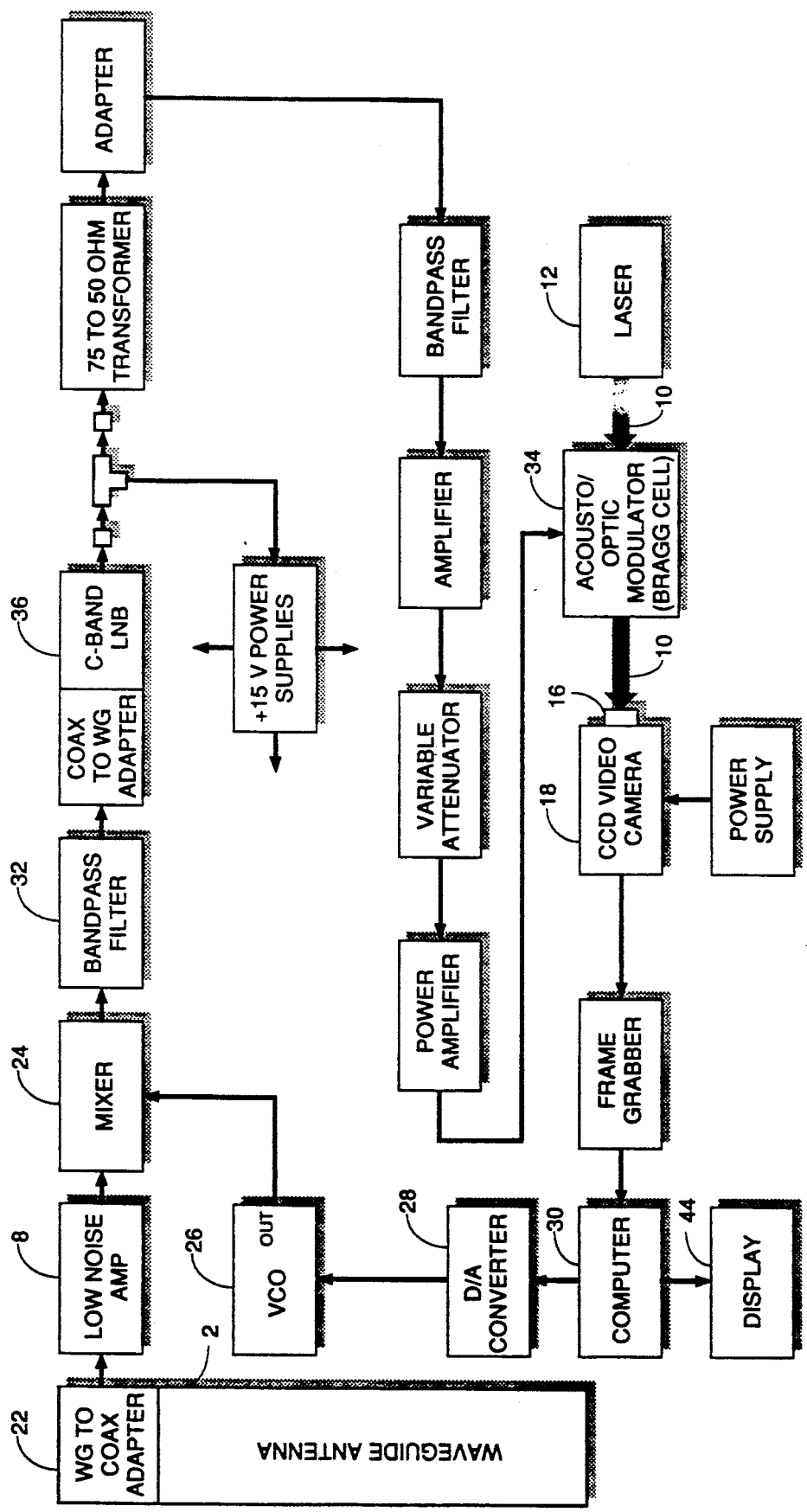
FIG. 3 is a block diagram of a preferred embodiment of the present invention.

FIG. 3 is a block diagram showing in detail the equipment used to construct this preferred embodiment of the present invention. The waveguide antenna used was constructed of type WR51 waveguide and supplied by Vantage Corporation of San Diego, Calif. Output from the antenna goes to coax adapter 22 which is connected by coax cable to low noise amplifier 8 made by MITEQ Corporation which provides a 15 dB gain for frequencies within the 17–21 GHz range. The output from amplifier 8 goes to mixer 24 where it is mixed with the output of variable frequency generator 26. Frequency generator 26 is controlled by D/A converter 28 which is regulated by computer 30. Computer 30 is programmed to cause frequency generator 26 to produce frequencies varying from 13 to 17 GHz. The output of mixer 24 goes to bandpass filter 32 (supplied by Trilithic Corporation) which is designed to pass only approximately 4 GHz signals. (Frequencies passed are between 3.75, and 4.25 GHz.)

Thus, when frequency generator 26 is producing 15 GHz and this frequency is combined with signal from antenna 2 produced by 19±0.25 GHz radiation, a 4±0.25 GHz difference signal will be produced which will pass bandpass filter 32. Therefore, the signal passing bandpass filter 32 with a 15 GHz mixing signal corresponds to 19±0.25 GHz radiation detected by antenna 2. This 4±0.25 GHz signal is converted and mixed again by appropriate electronic circuitry as shown in FIG. 3 to produce a 1.2±0.25 GHz signal corresponding to the 4±0.25 GHz signal passing through bandpass filters 32. This 1.2±0.25 GHz signal is amplified by appropriate circuitry as shown in FIG. 3 and the amplified signal drives acousto/optic modulator (Bragg cell) 34. The Bragg cell used in this prototype is a Gallium Phosphide (GaP) cell supplied by Brimrose Corporation, Baltimore MD. The cell has a center frequency of 1.2 GHz and a bandwidth of 500 MHz. (i.e., an operation range of 1.2±0.25 GHz.) The Bragg angle is 3.8 degrees for 700 nm and the defraction efficiency at 0.8 Watt is 60%. The 1.2±0.25 GHz signal sets up an interference pattern in Bragg cell 34 which diffracts laser beam 10 from laser 12. Pixel array 16 of video camera 18 is appropriately positioned to detect the diffracted portion of beam 10 (at 700 nm). (The undiffracted portion of the beam passes and does not illuminate pixel array 16.)

Therefore, when a source of microwave radiation is being detected by antenna 2 and the signal is passed through bandpass filter 32 as described above, laser light from laser 12 will be detected by video camera 18 and the intensity of the light detected will be generally proportional to the intensity of the microwave radiation being detected and passed through filter 32. When no microwave radiation passes through bandpass filter 32, Bragg cell 34 is not modulated and the laser beam 10 from laser 12 is not diffracted and passes straight through Bragg cell 34 and is not detected by video camera 18.

VERTICAL STEERING

The spacing between the slots on antenna 2 are 0.344 inches (0.874 cm). This corresponds to $\frac{1}{2}$ wavelength of 20.7 GHz microwave radiation within antenna 2. The wavelength within the antenna is given by the following formula:

$$\lambda_g = \lambda \left[ \epsilon - \left( \frac{\lambda}{\lambda_c} \right)^2 \right]^{-\frac{1}{2}}$$

where:
$\lambda_g$ is the wavelength within the antenna
$\lambda$ is the wavelength in space for 20.7 GHz microwave radiation (which is 0.5693 inches)
$\lambda_c$ is the cutoff frequency for this antenna (which is 1.01833 inches)
$\epsilon$ is the dielectric constant for air (which is 1.00064).

Figure 4:
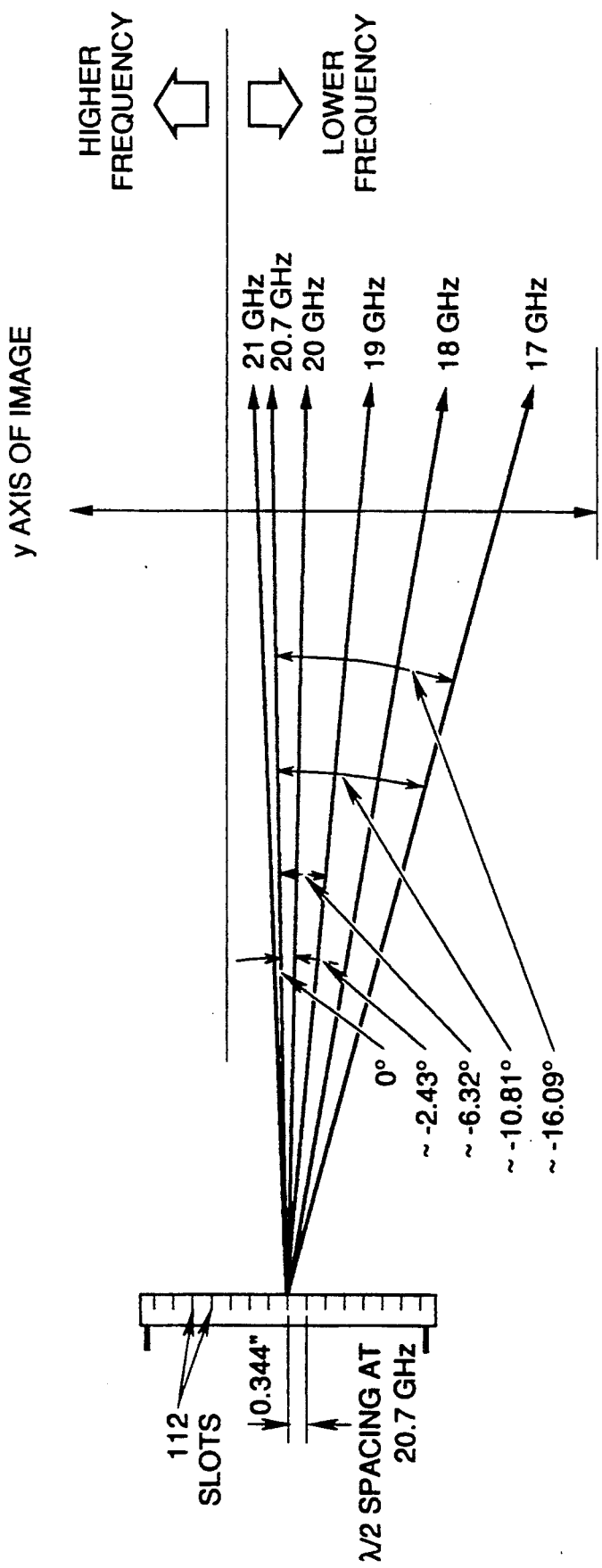
FIG. 4 is a drawing showing the relationship between beam angle and microwave frequency for the antenna shown in FIGS. 2A and 2B.

Therefore, 20.7 GHz microwave radiation entering the slots from broadside will constructively interfere in such a way as to produce standing microwave signal in the antenna which is transmitted out of antenna 2 through coaxial adaptor 22. Microwave radiation at 20.7 GHz entering the slots from small angles other than broadside will not constructively interfere in the wave guide. However, there will be interference for slightly different frequencies at various angles other than broadside. For the antenna shown in FIGS. 1A, 1B, 2A and 2B the relationship between beam angle and the frequency which will produce constructive interference is shown in FIG. 4.

As indicated above, in order to determine the intensity of the broadside radiation in the range of 20.7 GHz, the signal from the antenna is mixed with mixing signal at about 16.7 GHz which produces a difference signal of about 4 GHz which is filtered through filter 32 which blocks all frequencies not in the range of about 4±0.25 GHz. The signal passing through filter 32 is amplified converted and mixed again to 1.2±0.25 GHz. This 1.2±0.25 GHz signal is amplified and the amplified signal drives Bragg cell 34. Thus, when frequency generator 26 is producing approximately 16.7 GHz, the only microwave energy producing modulation in Bragg cell 34 is microwave energy in the range of about 20.7 GHz. Antenna 4 will collect 20.7 GHz microwave energy only if it is entering the antenna broadside (i.e at approximately 0 degrees [horizontal] as shown in FIG. 4).

For example, if a source of 20.7 GHz microwave radiation were to be located at say, 10.8 degrees below broadside, radiation from the source would not constructively interfere in the antenna and the antenna would not "detect" the signal. However, if a microwave source in the range of 18 GHz were located at 10.81 degrees below the horizontal, radiation from the source would constructively interfere in the waveguide and a signal corresponding to this radiation would be "detected" by the waveguide antenna and would be transmitted out of the waveguide antenna.

In order for this signal to modulate Bragg cell 34, a mixing signal of 14 GHz is provided by frequency generator 26 to produce a difference signal in the range of about 4±0.25.GHz which passes bandpass filter 32, is amplified and modulates Bragg cell 34. Thus, Bragg cell 32 is now being modulated by approximately 18 GHz microwave radiation source located about 10.81 degrees below the horizon. Similarly, microwave frequencies between 17 GHz, and 21 GHz can be made to modulate Bragg cell 34 by providing mixing frequencies of 13 to 17 GHz provided the signals originate at the appropriate elevation on the vertical axis as shown in FIG. 4.

The operation of this device as a microwave camera is based on the assumption that objects of interest will produce microwave radiation more or less uniformly as a function of frequency over its surface area of interest in the range of 17 GHz to 21 GHz. Thus, the antenna can be made to "look" in any vertical direction between −16.09 degrees and +1 degrees by merely varying the mixing frequency produced by generator 26 between 13 GHz and 17 GHz.

The bandpass of filter 32 is 4±0.25 GHz as stated above. This ±0.25 GHz range corresponds to a vertical angle of about 2 degrees. In our prototype demonstration embodiment, we designed the frequency generator controls to produce eight equally spaced frequencies between 13 GHz and 17 GHz, which meant that our vertical field-of-view was described by eight 2.125 degrees vertical slices between −16 degrees and +1 degrees.

Figure 5:
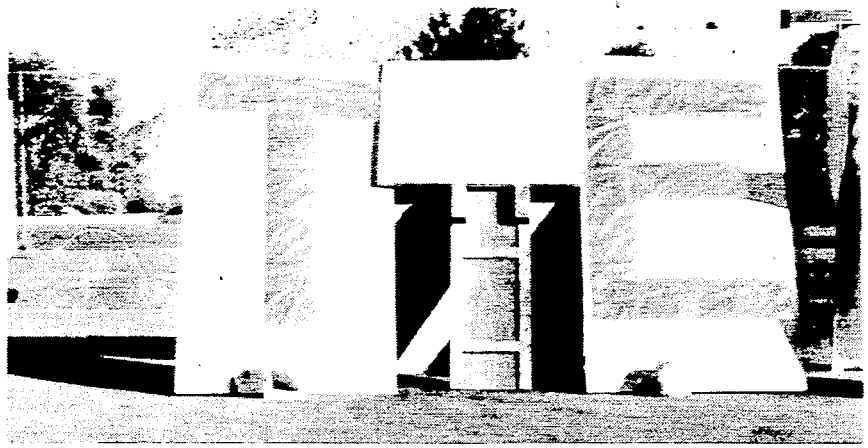
FIG. 5 is a reproduction of a photograph of an experimental target.
Figure 6:
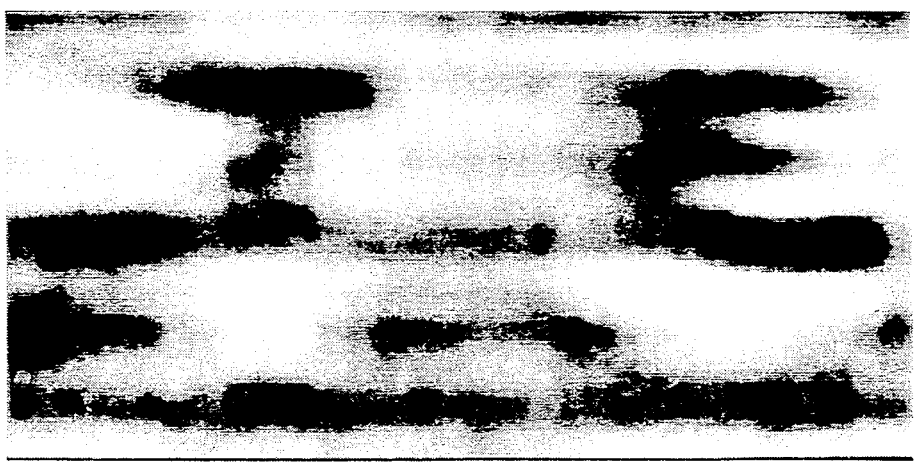
FIG. 6 is a microwave image of the target shown in the photograph of FIG. 5

Parabolic mirror 4 limited the horizontal field-of-view to 1 degree. Therefore our instantaneous field-of-view was about 1 degree wide. We were able to scan in the horizontal direction by rotating mirror 4 about its center of focus. For our demonstration, to take a microwave picture of the target shown in FIG. 5, we provided 30 equally spaced horizontal settings of 1 degree each for a total horizontal field-of-view of 30 degrees. Thus, we were able to create a total field-of-view of 30 degrees horizontal and 17 degrees vertical. To produce a "television" picture of our target area we scanned vertically for each horizontal setting and displayed the output incrementally on computer display 44. Then we proceeded to the next horizontal setting for another vertical display until we had covered the screen of monitor 44 with our 17 degrees×30 degrees pictures of the target area. Using this procedure we produced the image shown in FIG. 6 of the view shown in the photograph reproduced as FIG. 5. The TE in FIG. 5 was made of one foot wide strips of aluminum foil mounted on plywood and the plywood was tilted so the aluminum foil reflected the cold sky. The TE shows up as dark spots on FIG. 6. The microwave radiation emanating from the aluminum is very low since the emissions are low, since it is largely opaque to microwave radiation and since it is reflecting microwave radiation from the cold sky. The microwaves radiation from the plywood is high since its emissions are higher and since it is also fairly transparent to microwave radiation from the landscape behind it. In a subsequent demonstration we turned the boards around and took a picture of the TE through the plywood boards!

ACOUSTO-OPTIC ONE DIMENSIONAL IMAGING

The arrangement shown in FIGS. 1A, 1B, 2A and 2B can be used to provide acousto-optic imaging in one dimension.

Figure 7A:
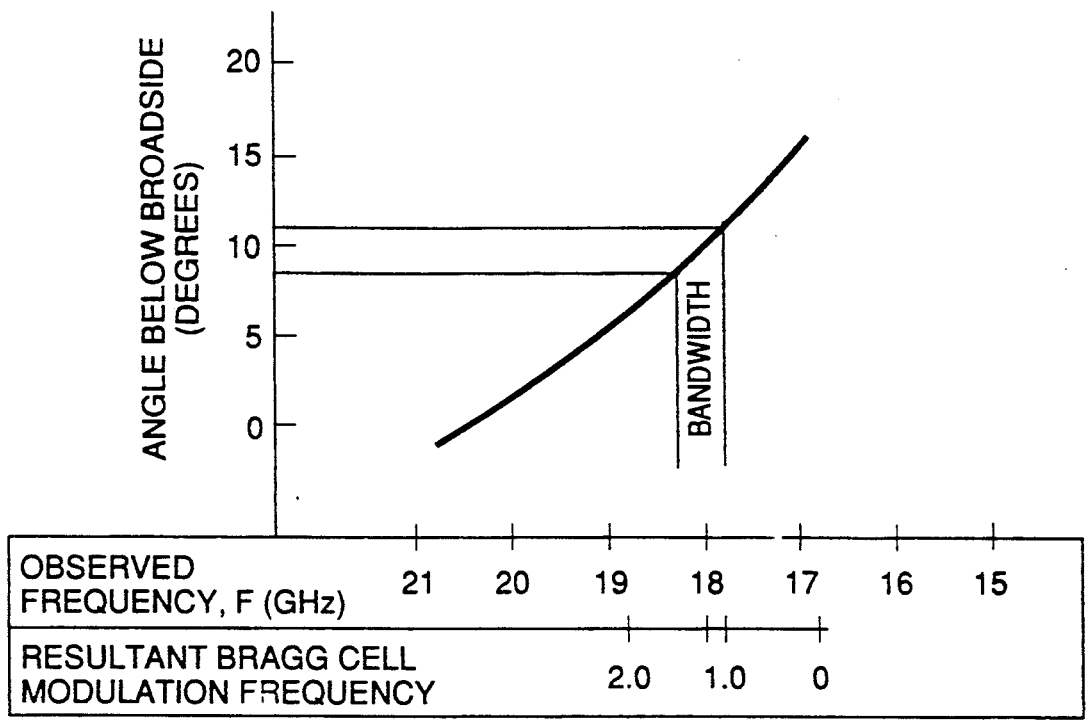
FIG. 7A is a graph showing the relationship of beam angle to frequency with designation of the band width of a Bragg cell used in a preferred embodiment of the present invention.
Figure 7B:
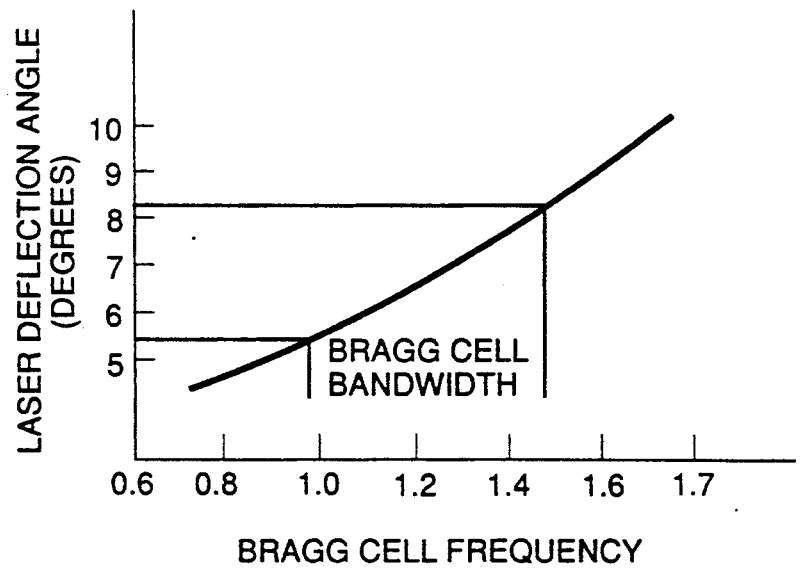
FIG. 7B is a graph showing the relationship between laser deflection angle as a function of acoustic frequency for the Bragg cell referred to above.
Figure 8:
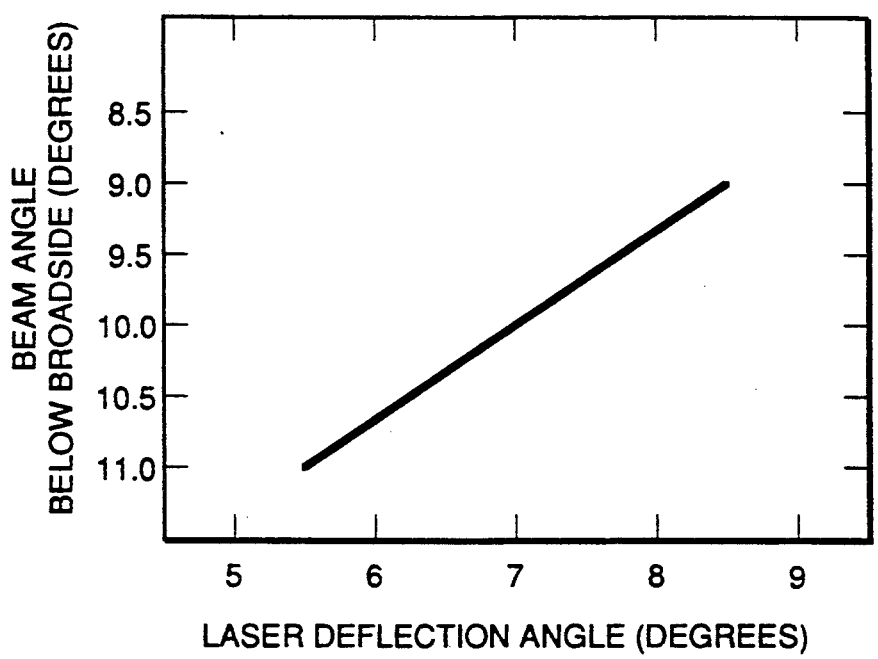
FIG. 8 is a graph combining the results of FIGS. 7A and 7B and showing the relationship between beam angle below broadside and laser diffraction angle.
Figure 9:
FIG. 9 shows some of the results of a test demonstrating an embodiment of the present invention.
Figure 11:
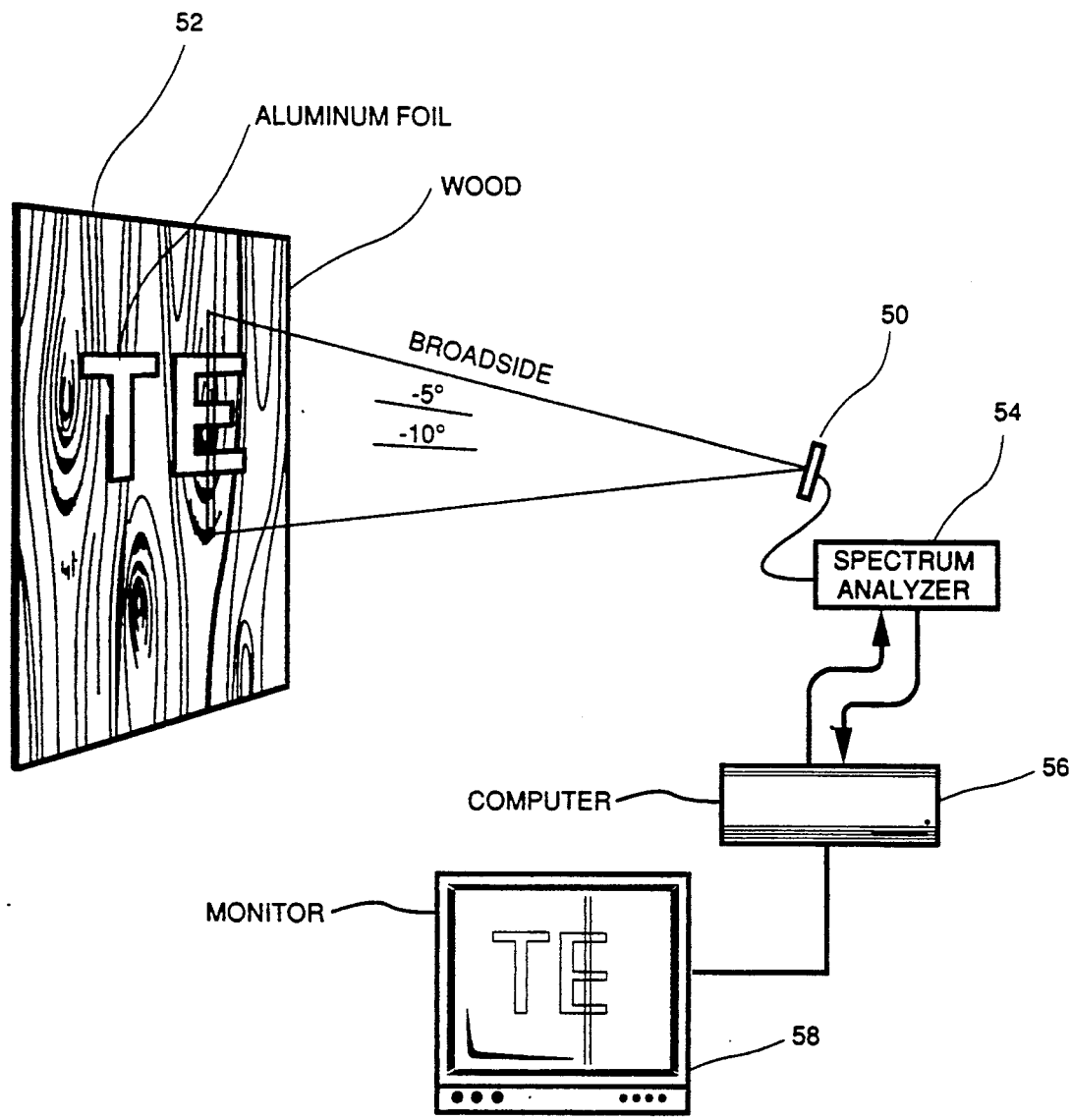
FIG. 11 shows the test set up for producing the image shown in FIG. 6

The antenna system shown in FIG. 1A, 1B, 2A and 2B has a beam direction-frequency relation shown in FIG. 7A. The Brimrose Corporation gallium phosphide Bragg cell 34 depicted in FIG. 1B and described above has a laser beam diffraction-Bragg cell frequency relationship as shown in FIG. 7B. Thus, when a frequency of 14 GHz is output from VCO 26 and mixed with the antenna output, bandpass filtered 32, and then down-converted to 1.2 GHz by C-band low noise block down-converter 36, and the net result fed to Bragg Cell 34, the direction of laser beam 10 from laser 12 will be diffracted by microwave radiation from sources which are located within the vertical field-of-view between about 9° and 11° below the antenna broadside as shown on FIG. 7. A point (or horizontal line) broad band microwave source located at 11° would cause a diffraction pattern in Bragg cell 34 to be set up which would diffract laser beam 10 about 5.5°. A point (or horizontal line) broad band source located at 9° would cause a separate pattern to be set up which would diffract the beam about 8.2°. Both (in fact many) diffraction patterns can exist in the Bragg cell at the same time. So that two sources, one at 9° and the other at 11° would show up as two horizontal lines on monitor 44 corresponding to a 5.5° and an 8.2° diffraction of laser beam 10. This system thus produces a real time one dimensional image of the two point (or line) microwave scene. FIG. 8 combines the information in FIGS. 7A and 7B. The results of a demonstration proving this principal is shown in FIG. 11. The lower part of FIG. 9 shows 7 targets located about 50 feet from antenna 2. The targets consisted of 1 foot wide strips of aluminum foil placed horizontally on a plywood background. The target was tilted so that the sky would be reflected from the foil to the antenna. The strip positions were low, center and top. From left to right the arrangement were: (1) low, (2) low and center, (3) low, center and top, (4) center and top (5) top, (6) top and low and (7) low. The one dimensional real time images of center portions of these 7 targets are shown directly above each of the targets at the top of FIG. 11. The aluminum foil strips appear as dark thick strips on a white background. Thus, the prototype produces a one dimensional real time image of a field-of-view which is about 1° in the horizontal and 2° in the vertical. A two dimensional essentially real time image could be provided by rotating the antenna or monitoring the antenna on a moving vehicle and displaying sequential vertical images side-by-side on the monitor. For example, if the antenna is rotated at 1° per second and a new image is displayed and stored each second respectively on a 4 inch by 1 inch adjacent sections of the monitor, at the end of 10 seconds, we would have a 4 inch by 10 inch image of a 2° vertical by 10° horizontal field-of-view.

OTHER EMBODIMENTS

As indicated in FIG. 11, any microwave antenna system 50 providing a beam which can be frequency scanned can be utilized in the practice of this invention. Also, any of many available spectrum analyzers 54 capable of analyzing the spectrum of the radiation being received by antenna 54 can be used. Frequency scannable antenna types which are available include the following:

Waveguide antenna with slots
Helical transmission line with taps
Dielectric rod transmission line with taps
Transmission grating
Reflecting grating
Dispersive prism
Parallel plate transmission line with taps
Dielectric slot transmission line with taps
Stripline with taps
Microstrip with taps.

Figure 12:
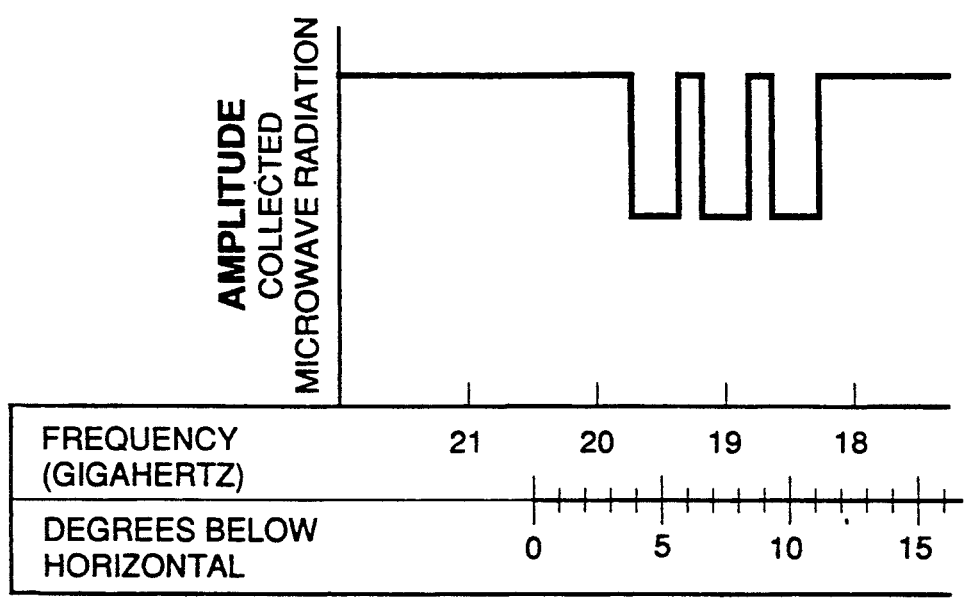
FIG. 12 shows qualitatively the amplitude of collected microwave radiation as a function of beam angle for one of the test runs depicted in FIG. 11.

In the arrangement shown in FIG. 11, antenna 50, which could be any of the antenna listed above, collects microwaves from target 52 which in this example is made of aluminum foil letters TE on a plywood background. The target is tilted backward so that the TE will reflect the cold sky. Output from the antenna is analyzed by spectrum analyzer 54. The output of analyzer 54 is utilized by computer 56 to create an image which may be displayed on monitor 58. In this case the figure shows a vertical instantaneous field-of-view of a section of an E in target 52. The output analysis of spectrum analyzer, for the single vertical strips is depicted in FIG. 12. As indicated on FIG. 12 the radiation from the aluminum portions of the target are substantially lower than from the plywood and show up as three negative blips. As indicated in FIG. 11 computer 56 correlates the negative blips with the frequency being detected and plots an appropriate output on monitor 58 at the appropriate vertical and horizontal direction. In general a one dimensional image is produced by creating on monitor 58 spots of varying brightness based on the amplitude of the spectrum analyses and vertical positioning of such spots is determined by the frequency. Horizontal positioning is based on the direction of the antenna beam. Spots can also be created of various colors instead of brightness in order to demonstrate intensity. By rotating the antenna the remainder of the target can be scanned and plotted on monitor 58. Scanning can also be accomplished by moving antenna 50 in a direction parallel to the area being imaged or by moving target 52 across the narrow vertical beam of antenna 50.

REAL TIME ARRAY CAMERA

Figure 10:
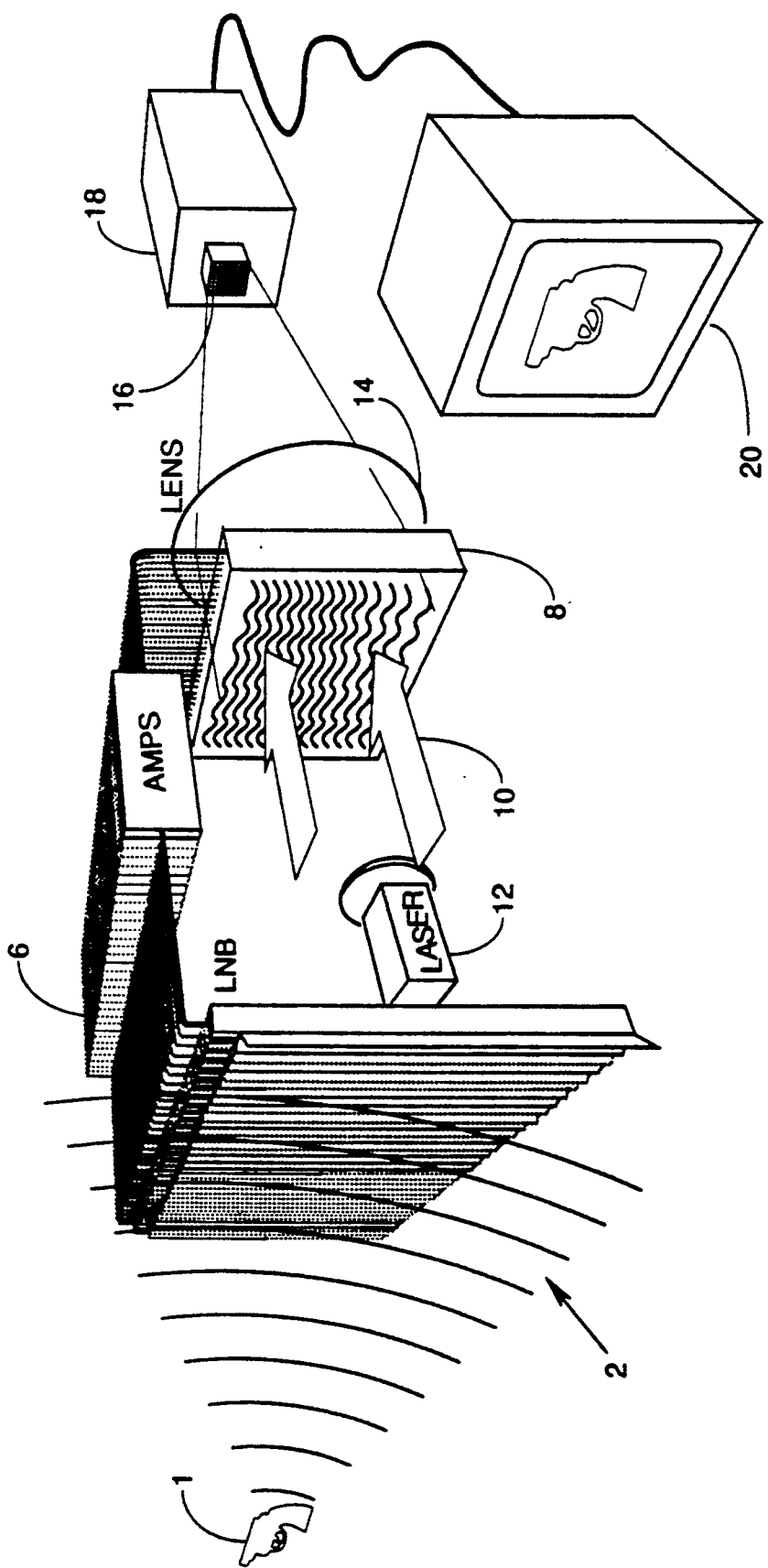
FIG. 10 is a diagram of an embodiment of the present invention for producing real time two dimensional microwave images.

An embodiment of the present invention providing a real time two dimensional image is shown in FIG. 10. For this embodiment an array of 32 antennae are utilized. The signal from each of these antennae are processed as described above with respect to the single antenna system and the resulting signals are fed into a multi-channel (i.e., 32 channels) Bragg cell such as a 32 channel model M GPD-80-50 gallium phosphide cell supplied by Brimrose Corp. of Baltimore Md.

Vertical spatial resolution is produced as described above under the section entitled acousto-optic one-dimensional imaging. Horizontal spatial resolution is produced as qualitatively described in FIGS. 14–16.

Microwave source S is located 100 meters from, and on the right side of the field-of-view of antenna array 60 which is 10 meters wide. Radiation from source S has to travel 0.5 m further to reach the left side of array 60 as compared to the right side. This means that a wavefront from source S arrives on the left side of antenna array 60 about $0.17 \times 10^{-8}$ seconds after the arrival on the right side of the same wavefront.

Figure 13A:
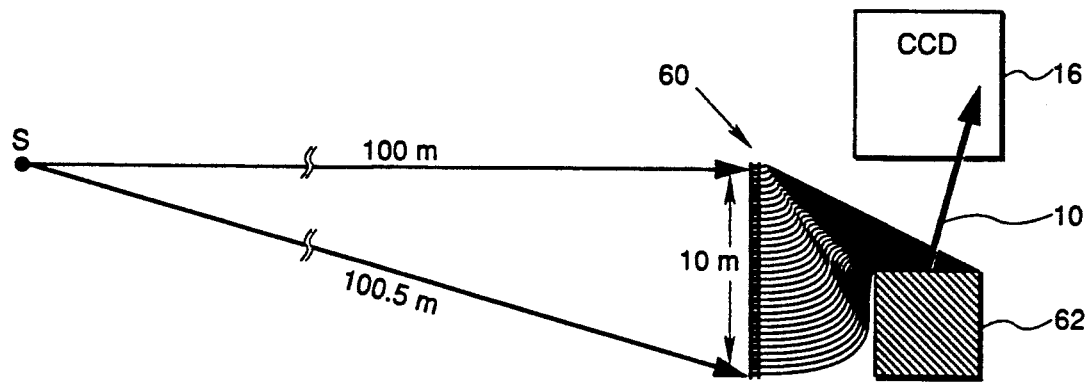
FIGS. 13A, 13B, and 13C demonstrate qualitatively how a two dimensional image is formed using the embodiment shown in FIG. 10.
Figure 13B:
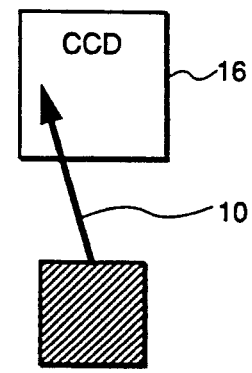
Figure 13C:
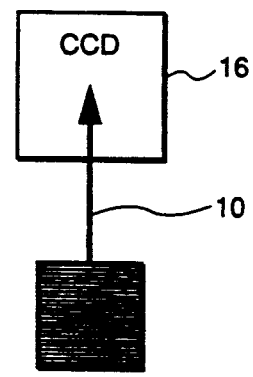

This $0.17 \times 10^{-8}$ second delay results in a phase shift in the Bragg cell of $1.2 \times 10^9$ cyc/sec acoustic waves or about two wavelengths between the left and right sides of the aperture of the cell. The net result that the diffraction planes in the Bragg cell are tilted as shown in FIG. 13A so that laser beam 10 is diffracted to the right corresponding to the location of source S as shown in FIG. 13B. If source S were relocated to the left side of the field-of-view, the diffraction planes in Bragg cell 62 would reverse as shown in FIG. 13C causing laser beam 10 to shift to the left of array 16 and a source in the center of the field-of-view should result in the beam centering on array 16 as shown in FIG. 10. As stated above a great many diffraction patterns can exist in cell 62 at the same time so that complicated images can be provided as indicated on the monitor in FIG. 10.

CONCLUSION

While the above description contains many specifications, the reader should not construe these a limitation on the scope of the invention, but merely as exemplifications of preferred embodiments thereof. Accordingly the reader is requested to determine the scope of the invention by the appended claims and their legal equivalents, and not by the examples given above.

We claim:

1. A microwave camera system for imaging objects within a field-of-view comprising:
    a) an antenna means having a frequency dependent beam direction for collecting microwave radiation,
    b) a spectrum analyzer means for producing analysis of the spectrum of at least a portion of said collected radiation, said spectrum analyzer means comprising a Bragg cell and a laser,
    c) an imaging means for producing an image of said objects based on said analysis.

2. A system as in claim 1 wherein said imaging system comprises a television camera.

3. A system as in claim 1 wherein said antenna means is chosen from a group of antenna consisting of:
    a. helical transmission line with taps
    b. dielectric rod transmission line with taps
    c. coaxial transmission line with taps
    d. transmission grating
    e. reflection grating f. dispersive prism
g. parallel plate transmission line with slots
h. dielectric slot transmission lines with taps
i. stripline with taps
j. microstrip with taps
k. waveguide with slots
l. individual antennae interconnected with coaxial cable delay lines.

4. A system as in claim 1 wherein said antenna means comprises a plurality of antenna and wherein said Bragg cell comprises a plurality of channels.

5. A system as in claim 4 wherein each of said plurality of antenna is connected to a separate channel of said plurality of channels.

6. A system as in claim 5 wherein said image producing means is a two dimensional image producing means for producing two dimensional images.

7. A camera system comprising:
   a. A detection means for detecting microwave radiation from sources within a field-of-view,
   b. a first conversion means for producing an electronic signal corresponding to at least a portion of said radiation detected by said detection means,
   c. a laser means for producing a laser beam,
   d. an acousto/optic laser diffraction means for diffracting a laser beam produced by said laser source,
   e. a second conversion means for converting said electronic signal to an acoustic signal suitable for driving said acousto/optic laser diffraction means,
   f. a light detection means for detecting a portion of said laser beam diffracted by said acousto/optic diffraction means,
said microwave detection means, said laser sources said diffraction means, said first and second conversion means and said light detection means being arranged so that laser light detected by said light detection means corresponds to microwave radiation emanating from objects located within said field-of-view.

8. The system as in claim 7 and further comprising a frequency scanning means for changing the instantaneous field-of-view in one dimension of a two dimensional field-of-view of said microwave detection means.

9. The system as in claim 8 wherein said frequency scanning means comprises a variable frequency generator to provide variable frequencies for mixing with the output of said first conversion means.

10. The system as in claim 7 wherein said microwave detection means is a waveguide antenna with slots.

11. The system as in claim 7 wherein said microwave detection means is chosen from a group of detection means consisting of:
   a. helical transmission line with taps
   b. dielectric rod transmission line with taps
   c. coaxial transmission line with taps
   d. transmission grating
   e. reflection grating
   f. dispersive prism
   g. parallel plate transmission line with slots
   h. dielectric slot transmission lines with taps
   i. stripline with taps
   j. microstrip with taps
   k. individual antennae interconnected with coaxial cable delay lines.

12. The system as in claim 6 wherein said detection means is a plurality of individual detection means aligned in an array and phased together as to provide image definition in the unscanned direction.

13. The system as in claim 12 wherein said array is a uniform array.

14. The system as in claim 7 wherein said array is a sparse array.

15. The system as in claim 12 and further comprising an electronic steering means such as phase shifters or diodes to provide image definition in the unscanned direction.

16. The system as in claim 7 and further comprising frequency scanning means for changing the instantaneous field-of-view in a least two directions.

17. The system as in claim 16 wherein said two directions are normal to each other.

18. The system as in claim 7 and further comprising a source of microwave radiation for illuminating said field-of-view.

19. The system as in claim 7 wherein said detection means is a plurality of acousto/optic laser diffraction means comprises a plurality of channels.

20. the system as in claim 19 wherein each of said plurality of antenna is connected to a separate channel of said diffraction means.

21. The system as in claim 20 wherein said light detection means comprises a two dimensional array of light detection to permit a two dimensional image of microwave sources within said field-of-view to be produced based on the degree of diffraction of said laser source by said diffraction means.

* * * * *